United States Patent
Takahashi et al.

(10) Patent No.: US 7,601,008 B2
(45) Date of Patent: Oct. 13, 2009

(54) SOCKET ADAPTOR APPARATUS

(75) Inventors: Hideyuki Takahashi, Shizuokaken (JP); Kiyokazu Ikeya, Shizuokaken (JP)

(73) Assignee: Sensata Technologies, Inc., Attleboro, MA (US)

( * ) Notice: Subject to any disclaimer, the term of this patent is extended or adjusted under 35 U.S.C. 154(b) by 0 days.

(21) Appl. No.: 12/136,460

(22) Filed: Jun. 10, 2008

(65) Prior Publication Data

US 2009/0017703 A1 Jan. 15, 2009

(30) Foreign Application Priority Data

Jul. 9, 2007 (JP) .............................. 2007-179444

(51) Int. Cl.
*H01R 12/00* (2006.01)
(52) U.S. Cl. .................... 439/70; 439/700; 439/841; 439/81
(58) Field of Classification Search ............... 439/131, 439/700, 246, 67, 66, 70, 841, 83, 81
See application file for complete search history.

(56) References Cited

U.S. PATENT DOCUMENTS 4,029,375 A * 6/1977 Gabrielian .................. 439/66
6,716,043 B2 * 4/2004 Ishizuka .................... 439/131
7,025,602 B1 * 4/2006 Hwang ....................... 439/66

FOREIGN PATENT DOCUMENTS

JP 3737078 11/2005

* cited by examiner

*Primary Examiner*—Neil Abrams
*Assistant Examiner*—Phuong Nguyen
(74) *Attorney, Agent, or Firm*—Russell E. Baumann

(57) ABSTRACT

A socket adaptor 10 made of an electrically insulating material has a main adaptor body 12 on which a plurality of through holes 14 containing an upper opening and a lower opening has been formed. In certain preferred embodiments a probe pin 60 and coil spring 62 is placed in each through hole 14. An electrical engagement clipping part 68 for clipping a contact inserted in a respective through hole from said upper opening is formed on the upper end of each probe pin 60. The coil spring 62 is installed on each probe pin and biases the respective probe pin toward a position so that a tip formed on the lower end of the probe pin protrudes from the lower opening.

7 Claims, 13 Drawing Sheets

SOCKET ADAPTOR APPARATUS

FIELD OF THE INVENTION

This invention relates generally to an adaptor for sockets that mount a semiconductor device and more particularly to a socket adaptor that provides an interface of an electrical connection between contacts of a socket and electrodes of a circuit substrate.

BACKGROUND OF THE INVENTION

A conventional socket for a BGA package is disclosed in Japanese Patent No. 3737078, issued Nov. 4, 2005, by way of example. This patent shows a socket that is capable of mounting or dismounting an electronic device that includes a semiconductor device of the surface mount type such as BGA or CSP.

According to the patent, the socket includes a base member, a cover member, a plurality of contacts, an adaptor which is capable of moving in a direction toward or away from the base member and which offers a mounting surface for a BGA, a latch member rotatably mounted on the base member and a positioning mechanism that moves in linkage with the movement of the cover member.

In addition, there are sockets that are opened and closed by a cover member rotatably mounted on the base member and that mount a semiconductor device, such as BGA, or the like, on the base member with means causing the cover member to engage in an alternating motion. These sockets have a plurality of contacts in the shape of a pin grid array protruding from the bottom, the contacts being inserted into through holes formed on the circuit substrate where they are soldered.

The socket for semiconductor devices is mounted on a circuit substrate for measurement of electrical properties and reliability of the semiconductor device that has been mounted therein. For this mounting, the contacts of a socket and the circuit substrate are directly soldered as described above, with a result that it becomes difficult to disengage the socket.

Although it is conceivable to substitute the contacts of the socket with probe pins, the shape of the contact of a socket is complicated and, if it is used, the cost of the socket becomes extremely high.

SUMMARY OF THE INVENTION

An objective of this invention is the provision of an adaptor for sockets that solves the problem of the conventional art as described above whereby an existing socket can be easily mounted or dismounted on the circuit substrate, or the like.

The socket adaptor according to this invention is made of an electrically insulating member having a plurality of through holes formed therethrough, said through holes each including an upper opening and a lower opening. A probe pin made of electrically conductive material is accommodated in each of the said plurality of through holes with each probe pin having a clip portion thereon that electrically engages a contact when the contact is inserted from said upper surface opening and each probe pin has on its lower part a head portion that can protrude from a respective said lower opening. A spring member is accommodated in each of said plurality of through holes to bias said probe pins so that the tip portions can protrude from the lower opening, and said tip portions are capable of moving from said lower opening into the respective through hole in opposition to the bias of the spring member.

Preferably, the main adaptor body has a slot formed along each through hole and said probe pin is capable of sliding inside a respective slot and said main adaptor includes an upper adaptor and a lower adaptor. Said upper adaptor includes a protuberant portion that protrudes inwardly into the imaginary continuation of each though hole of the lower adaptor and said protruding part limits the position of one end of said spring member that has been accommodated in the respective through hole of the lower adaptor. The cross-sectional shape of the through holes of said upper adaptor is approximately rectangular and the cross-sectional shape of the through holes of the lower adaptor is approximately round.

Said clipping part preferably includes a pair of elastically deformable arms, the said pair of arms being connected to a body of the probe pin. A protuberance extends from each arm, generally halfway along its length, toward the opposing arm. Moreover, a protruding pin extends upwardly in the longitudinally axial direction of the probe pin from the said body between the pair of arms. The spring member, made of electrically conductive coil spring material, is received between said protuberances and the protruding pin on the body.

Preferably, said coil spring includes a contact part for electrically engaging an elongated contact member that is inserted from said upper opening. Said main adaptor body also includes either a positioning through hole or groove for fixing the socket thereto.

A socket adaptor made according to a preferred embodiment of the invention comprises a main adaptor body made of an electrically insulating material through which a plurality of through holes have been formed, each through hole having an upper opening and a lower opening and a plurality of spring members are respectively accommodated in said plurality of through holes, each spring member including a contact part that comes into contact with an elongated contact that is inserted from said upper opening and a lower part of each spring member protruding from said lower opening of said plurality of through holes.

According to this invention, it is possible to easily mount or dismount the socket on the circuit substrate. In case the socket is smeared, it is possible to easily clean the socket or reutilize the socket that has been removed from the circuit substrate.

BRIEF DESCRIPTION OF THE DRAWINGS

For a more complete understanding of the present invention and further advantages thereof, reference may be made to the following detailed description of the preferred embodiments taken in conjunction with the drawings in which.

DETAILED DESCRIPTION OF THE PREFERRED EMBODIMENTS

The above and other objects and features of the present invention will become apparent from the detailed description of the invention along with the drawings and appended claims.

Figure 1:
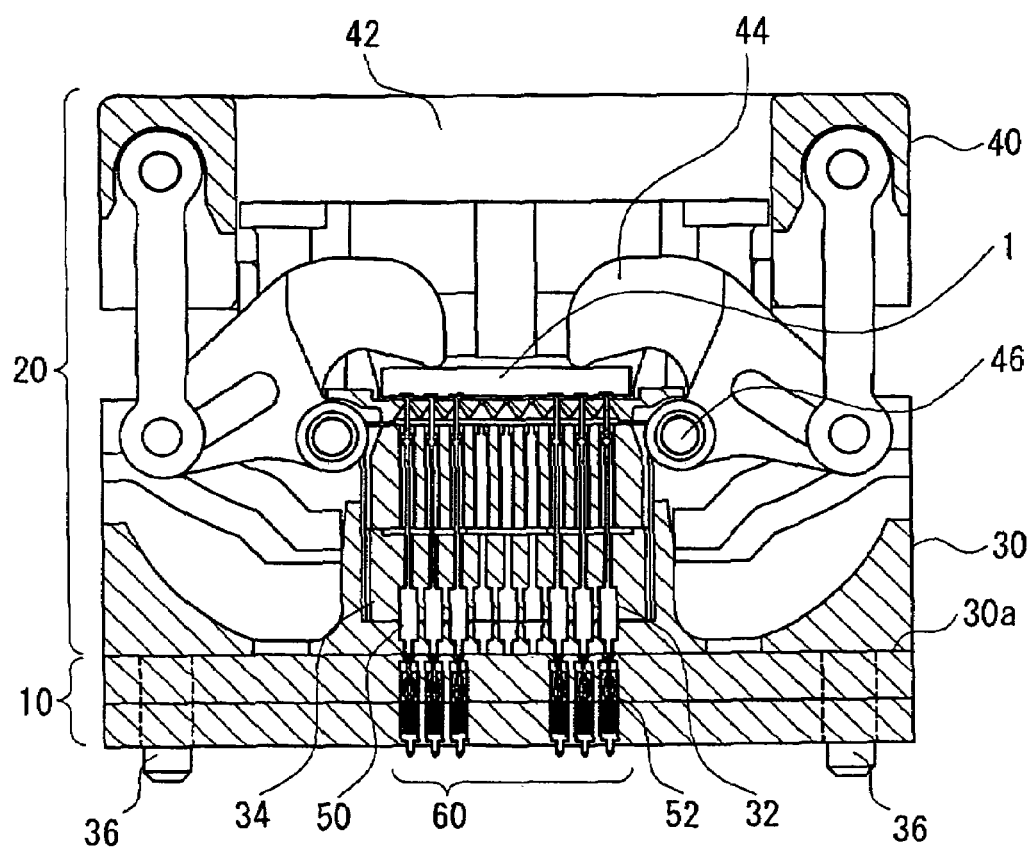
FIG. 1 is a cross-sectional view of a socket to which an adaptor made in accordance with a preferred embodiment of the invention has been attached.

FIG. 1 shows an example of a socket that has connected thereto a socket adaptor made according to a first preferred embodiment of this invention. Socket adaptor 10 is to be connected between a circuit substrate and the socket 20, thereby offering an electrical interface between the socket and the circuit substrate. It is possible to mount various packages such as BGA, LGA, PLCC and the like on socket 20. Socket 20, as shown in FIG. 1, includes a cover member 40 which is capable of a reciprocating motion toward and away from base member 30 and a plurality of elongated contact members 50 which have been mounted in base member 30.

A pair of coil springs (not shown in the drawings) is interposed between cover member 40 and base member 30 biasing cover member 40 is away from the base member. A generally rectangular opening 42 is formed approximately at the center of cover member 40 for loading and unloading devices to be tested. The upper surface of electronic package 1, loaded in the socket, is pressed downwardly as the rotation takes place with the rotary axis 46 as the center in linkage with the reciprocal motion of cover member 40.

Contacts 50, forming a line in each row and stoppers 32 of an electrically insulating material, are arranged approximately at the center of base member 30 with contacts 50 of each row electrically insulated by stoppers 32. In this manner, contacts 50 are arranged along two dimensions like a matrix array. In addition, a post 36 in the shape of a column which is to be used for positioning purposes is formed at each corner of the bottom 30a of base member 30.

The upper end of contacts 50 are electrically connected to respective terminals of package 1. Contact lead 52, which constitutes the lower end of each contact 50, protrudes from the bottom 30a of base member 30 for connection to the socket adaptor.

Figure 2A:
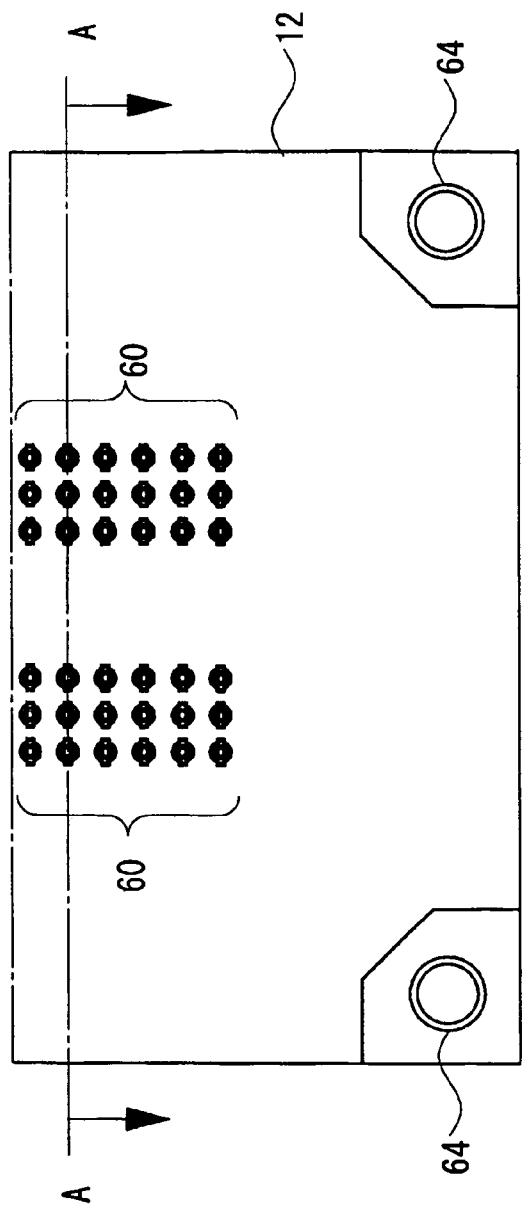
FIG. 2(a) is a top plan view of the socket adaptor according to the first preferred embodiment of the invention.
Figure 2B:
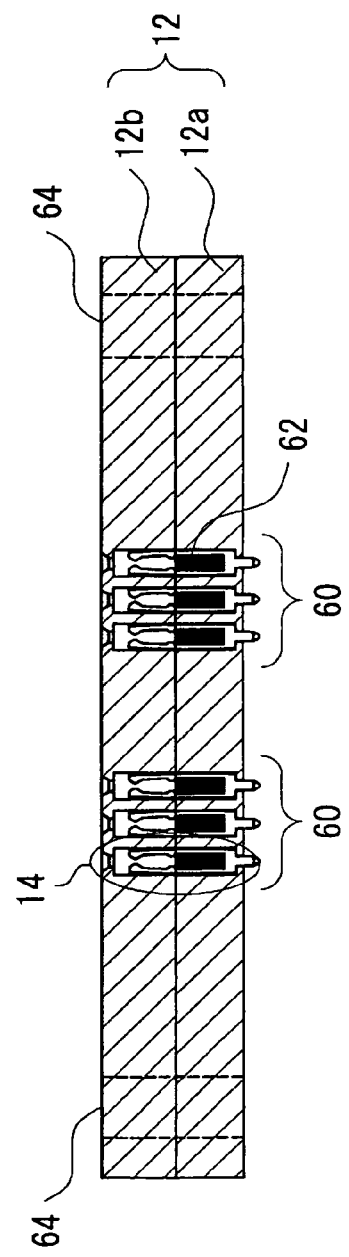
FIG. 2(b) is a cross-sectional view taken on line A-A of FIG. 2(a)

Socket adaptor 10 shown in FIGS. 2(a), 2(b) includes a main adaptor body 12 with through holes formed at locations corresponding to contact leads 52 plus a plurality of probe pins 60 that are accommodated, one in each through hole 14 of main adaptor body 12, and coil springs 62 which bias respective probe pins 60.

The main adaptor body 12 has a rectangular outside appearance; it has a two-layer structure including upper adaptor 12b and lower adaptor 12a. The lower adaptor 12a and the upper adaptor 12b have a plurality of through holes 14 at the positions that correspond to the contact leads 52. A columnar positioning through hole 64 having a somewhat larger opening diameter than the post portion 36 is formed at each corner part of main adaptor body 12 for the purpose of inserting the post portion 36 of socket 20.

The main adaptor body 12 is formed of suitable electrically insulting material such as highly heat-resistant resin polyether sulfon (PES). Materials other than PES which can be used include polyphenylene sulfide resin (PPS), liquid crystalline polymer (LCP), polysulfonic resin (PSP) and polyarylate resin (PAR).

Figure 3:
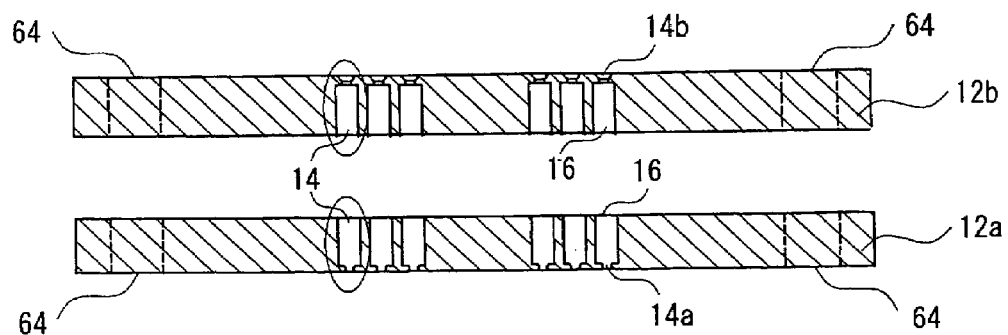
FIG. 3 is a cross-sectional view of the lower and upper adaptors separated from each other as viewed from the front side.
Figure 4A:
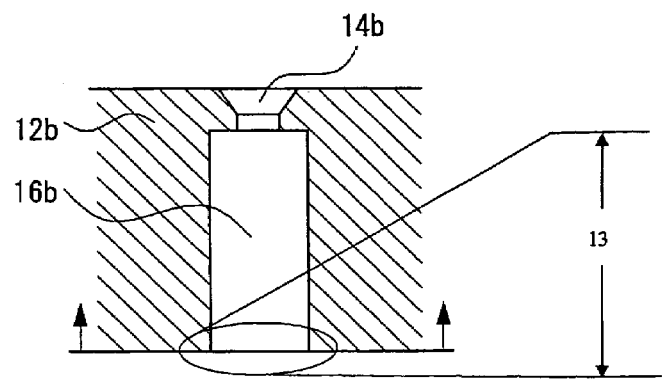
FIG. 4(a) is an expanded cross-sectional view of a portion of the upper adaptor of FIG. 3 including a through hole and FIG. 4(b) is a bottom plan view of the through hole and FIGS. 4(c), 4(d) are a cross-sectional and top plan views, respectively, of the through hole formed in the lower adaptor.
Figure 4C:
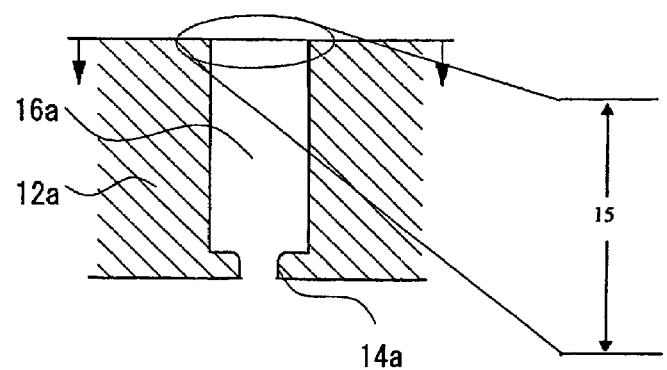
Figure 4B:
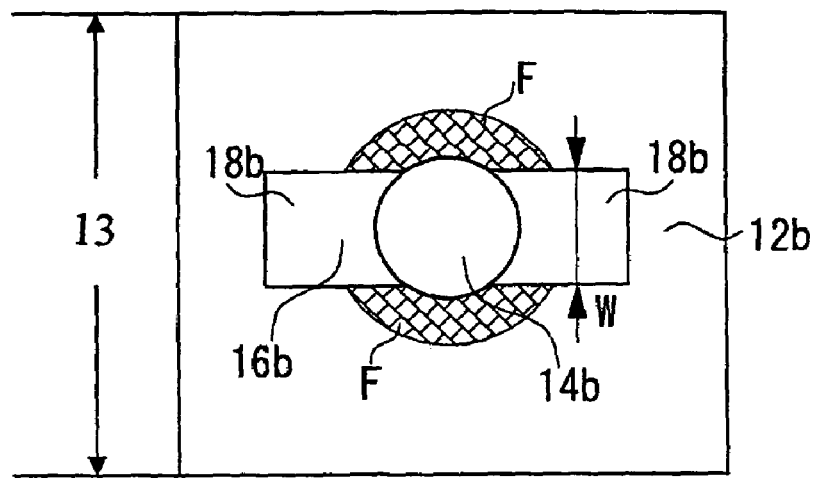
Figure 4D:
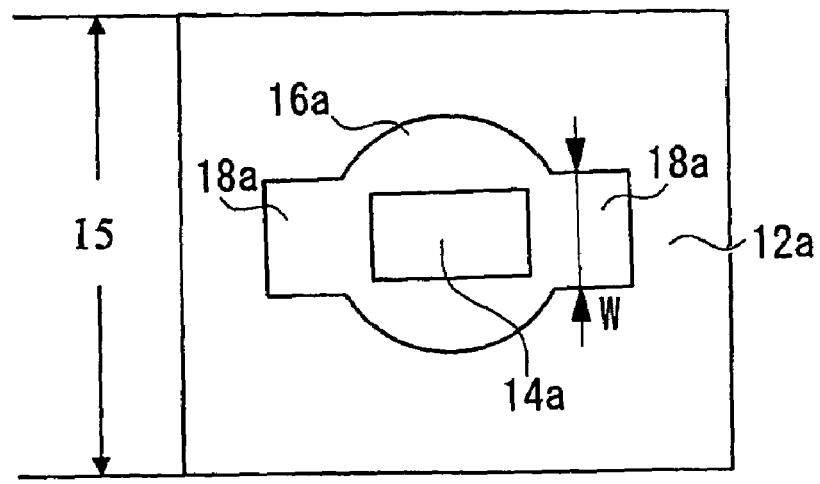
Figure 4E:
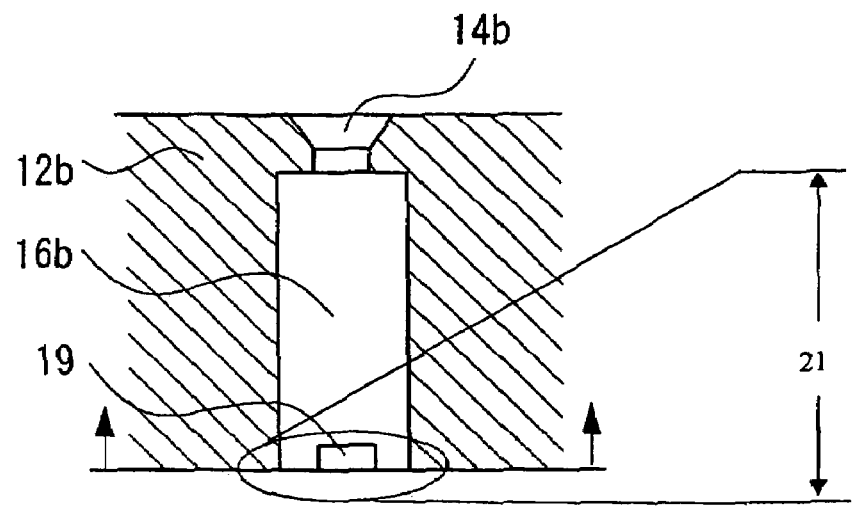
FIG. 4(e) is a cross-sectional view and FIG. 4(f) a bottom plan view of a variation of the shape of the through hole formed on the upper adaptor and FIGS. 4(g) and 4(h) are a cross-sectional and top plan views, respectively, of a through hole of the lower adaptor.
Figure 4G:
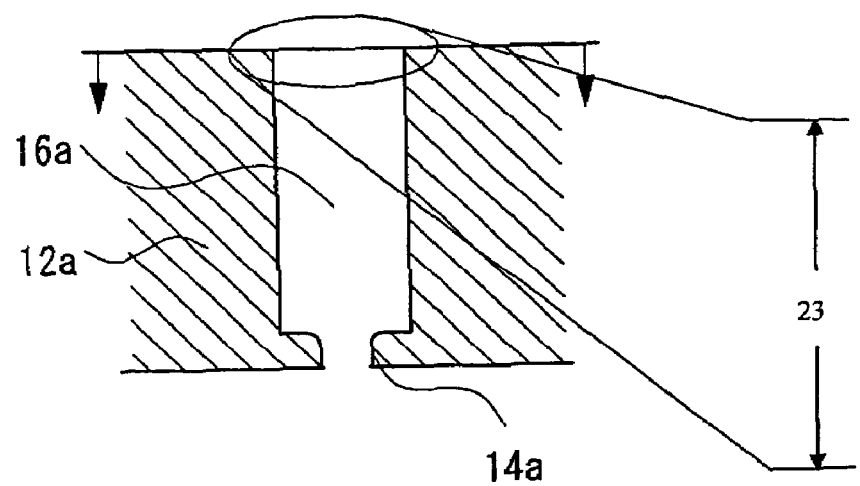
Figure 4F:
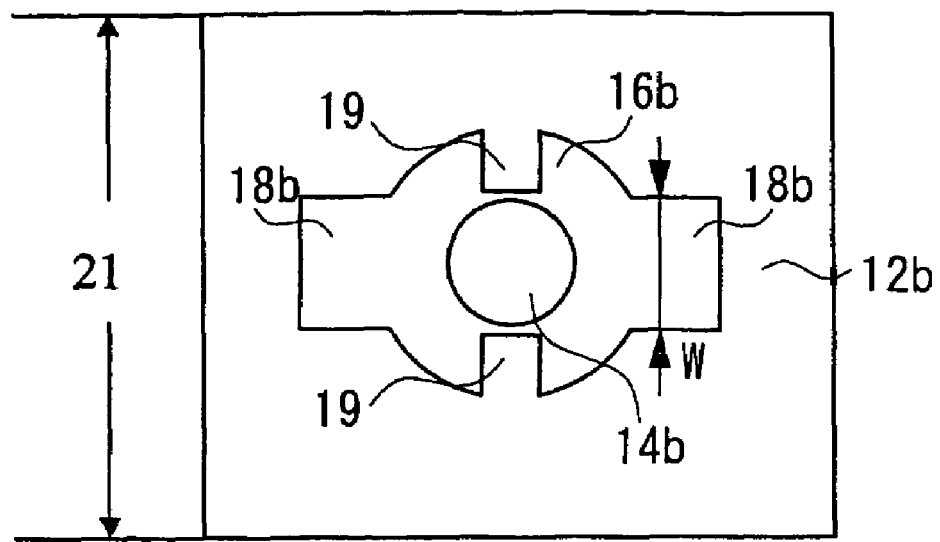
Figure 4H:
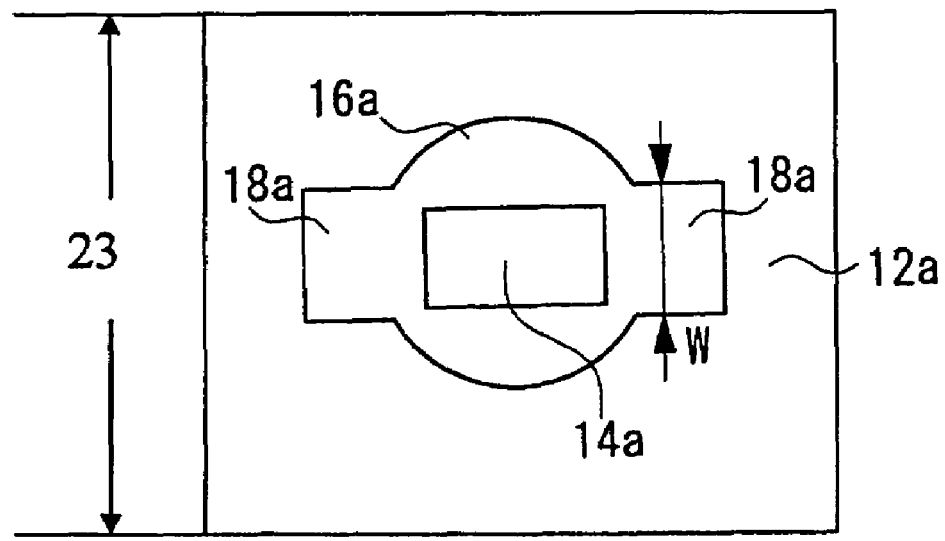

FIG. 3 shows the upper and lower adaptors spaced from each other. FIGS. 4(a) and 4(c) show expanded cross-sectional views and FIGS. 4(b) and 4(c) plan views of a through hole formed in upper adaptor 12b and lower adaptor 12a, respectively. See numerals 13 and 15 for referencing the plan views. The lower adaptor 12a has a lower surface opening 14a for the receipt of the tip of a probe pin 60 which is adapted to extend out of the opening. A lower through hole 16a is formed so that it is linked to lower opening 14a. A pair of aligned lower slots 18a is formed at a corresponding location in the thickness direction of lower through hole 16a of lower adaptor 12a. The width W of the pair of aligned lower slots 18a is made somewhat large relative to the thickness of the sheet of probe pin 60 to facilitate sliding motion of the probe pin in the perpendicular or longitudinal direction, thereby making it possible to restrict movement of probe pin 60 in the horizontal direction as well as its rotation.

Meanwhile, the upper adaptor 12b has an upper opening 14b formed with a conical lead-in shape on its upper surface to facilitate insertion of a contact lead 52 and has an upper through hole 16b formed to accommodate probe pin 60 linked to upper opening 14b. A pair of aligned upper slots 18b are formed extending along each upper through hole to accommodate respective probe pins 60 with the upper slots having a width W the same as width W of the lower slots 18a. When the lower adaptor 12a and the upper adaptor 12b are connected, each upper through hole 16b aligns with each respective lower through hole 16a to make one single through hole 14 and the lower slots 18a and the upper slots 18b become continuous. In this manner, probe pins are able to slide within respective through holes and slots.

In this connection, it is pointed out that the plan (horizontal) cross-sectional shape of the lower through holes 16a of lower adaptor 12a is approximately round while the plan (horizontal) cross-sectional shape 16b of upper adaptor 12b is approximately rectangular of a suitable size to form a differential surface range F on the bottom of upper adaptor 12b produced by the difference in shapes of the rectangular and circular through holes that, in effect, overlap or protrude into the imaginary continuation of lower through hole 16a. This surface range F serves to fix the position of the upper end of coil springs 62 that have been accommodated in through holes 14.

FIGS. 4(e)-4(h) show a variation of the shape of through hole 14. See numerals 21 and 23 for referencing plan views of FIGS. 4(f) and 4(h). On the upper adaptor 12b a pair of protruding portions or tabs 19 are formed that extend into each upper through hole 16b. The pair of protrusions 19 are formed with a selected thickness at a position 90 degrees from the upper slots 18*b* so that it will not interfere with the sliding motion of the probe pin 60. The pair of protrusions 19 fix the position of the upper end of coil springs 62 that have been accommodated in the through holes 14.

Figure 5A:
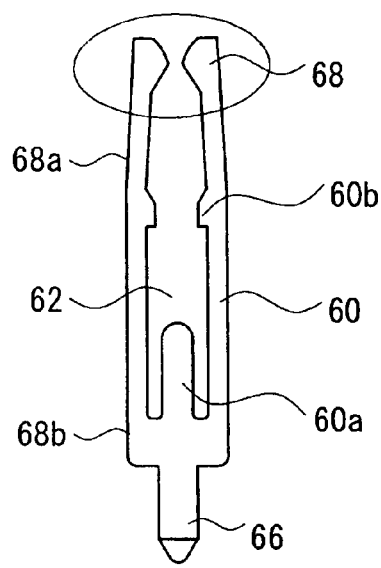
FIG. 5(a) is a front side view of a probe pin.
Figure 5B:
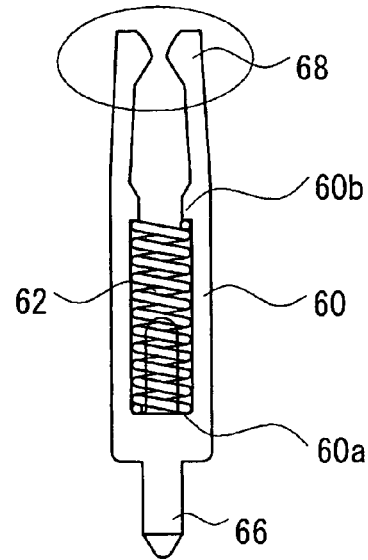
FIG. 5(b) is a front side view of the FIG. 5(a) probe pin shown with a coil spring installed thereon.

FIG. 5(*a*) is an elevational view of probe pin 60. The probe pin is composed of electrically conductive material and is formed by punching it out of a metal sheet, such as a sheet of beryllium copper or the like. A tip 66 is formed on the lower end of probe pin 60 and is adapted to extend out of lower opening 14*a*. The lower end of tip 66 is made approximately in the shape of a triangle forming a point contact for engaging an electrode located on a circuit substrate.

An electrical engagement part 68 is formed at the upper end of probe pin 60 for clipping electrical engagement with a contact lead 52. The clipping portion 68 includes a pair of elastically deformable arms 68*a* connected to base 68*b* of the probe pin. A pin shaped support 60*a* protrudes in the perpendicular or longitudinal direction generally half way between arms 68*a* and a protrusion 68*b* is formed approximately at mid-length on the each arm 68, each extending toward the opposed arm. As shown in FIG. 5(*b*), a coil spring 62 is placed on base 68*a* with support pin 60*a* received in the cavity at one terminal end of the coil spring and with the other terminal end of the coil spring engaging protrusions 60*b*.

As shown, coil spring 62 is somewhat compressed between base 68*b* and protrusions 60*b*. In this state, probe pin 60 is incorporated into a respective through hole on the main adaptor body 12.

Figure 6:
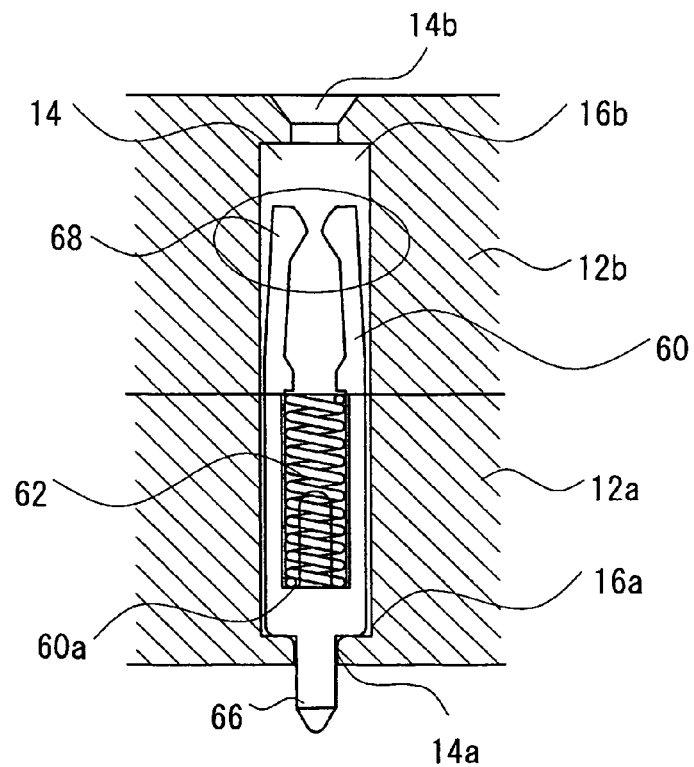
FIG. 6 is a cross-sectional view of a portion of the main adaptor body, as viewed from the front side, showing a through hole where a probe pin has been inserted.

FIG. 6 is an expanded cross-sectional view of the through hole of the main adaptor body into which a probe pin 60 and coil spring 62 have been incorporated. For assembly, the probe pins 60, each holding a respective coil spring 62 as shown in FIG. 5(*b*), are first inserted into a lower through hole 16*a*. The probe pins are inserted along the lower slots 18*a* and the tips 66 of the probe pins protrude from respective lower openings 14*a*

The upper adaptor 12*b* is fixed by means of a hook (not shown) on the upper surface of lower adaptor 12*a*. As a result, probe pins 60 are accommodated in through holes 14 of main adaptor body 12. The clipping part 68 of probe pins 60 are at a certain distance away from upper openings 14*b*. As the range F on the lower face of upper adaptor 12*b* engage the upper part of coil springs 62, tip portions 66 of the probe pins are constantly biased to extend out of the lower openings 14*a*.

It will be understood that the connection described for joining the lower and upper adaptors is not limited to the use of a hook but other joining means, such as adhesive, threaded members, etc. can also be employed.

Figure 7:
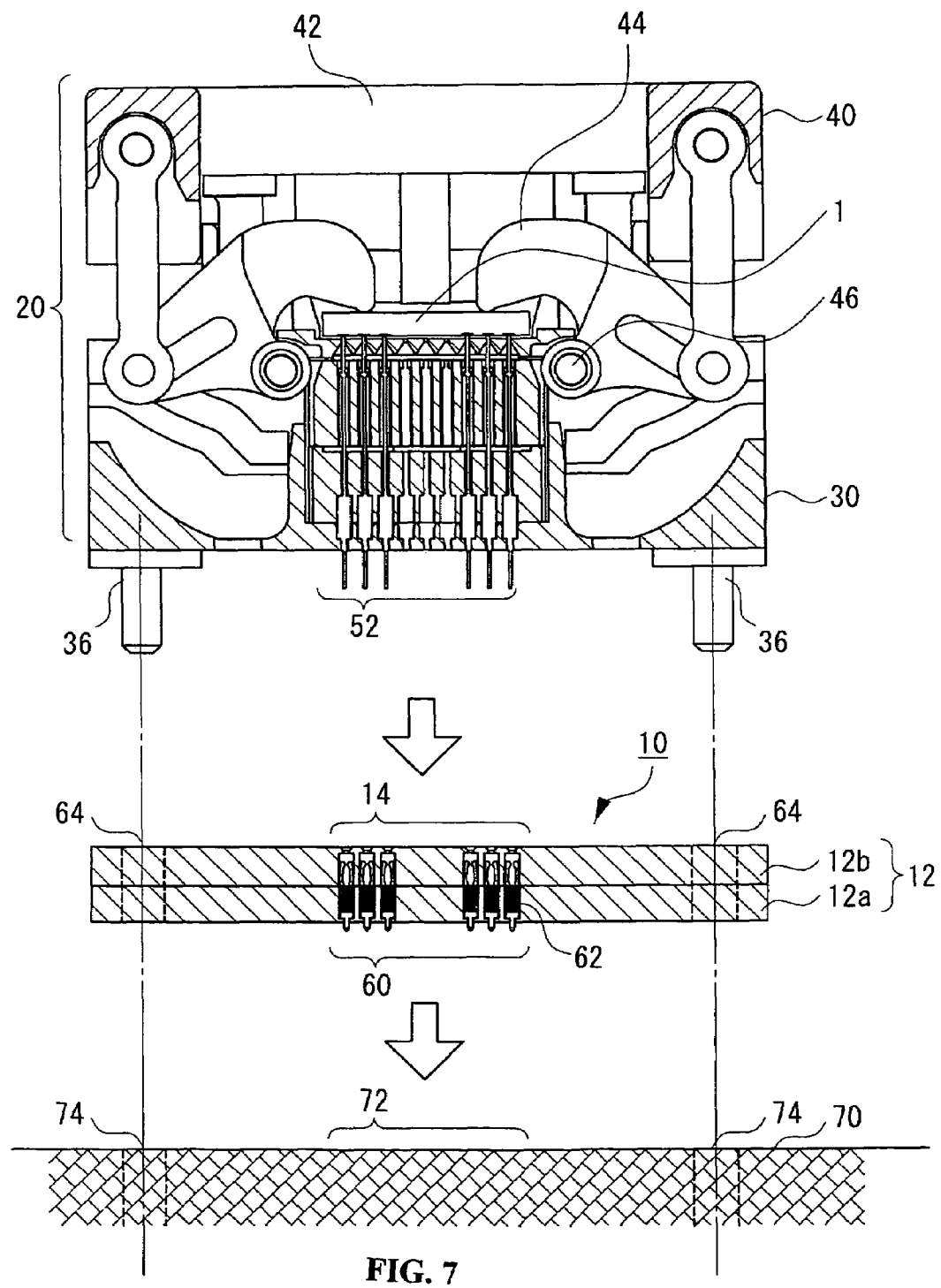
FIG. 7 is an exploded cross-sectional view of a socket, a socket adaptor made in accordance with the invention and a circuit substrate.

With reference to FIG. 7, socket adaptor 10 is installed on the circuit substrate 70 for measurement purposes, to cite an example. A plurality of electrically conductive electrodes or lands 72 are formed on the surface of circuit substrate 70 corresponding to the probe pin 60 array.

A package 1 is mounted or a socket 20 that has not as yet been mounted is connected to the socket adaptor 10 from the perpendicular direction. The post parts 36 are inserted into the positioning through holes 64 to position the socket and adaptor and then into holes 74 of the circuit substrate. As a result, contact leads 52 of socket 20 extend through respective upper openings 14*b* and are clipped by the clipping parts 68 of the probe pins in the through holes of the main adaptor body. In this manner, the socket 20 is connected to the circuit substrate 70 through socket adaptor 10.

Figure 8A:
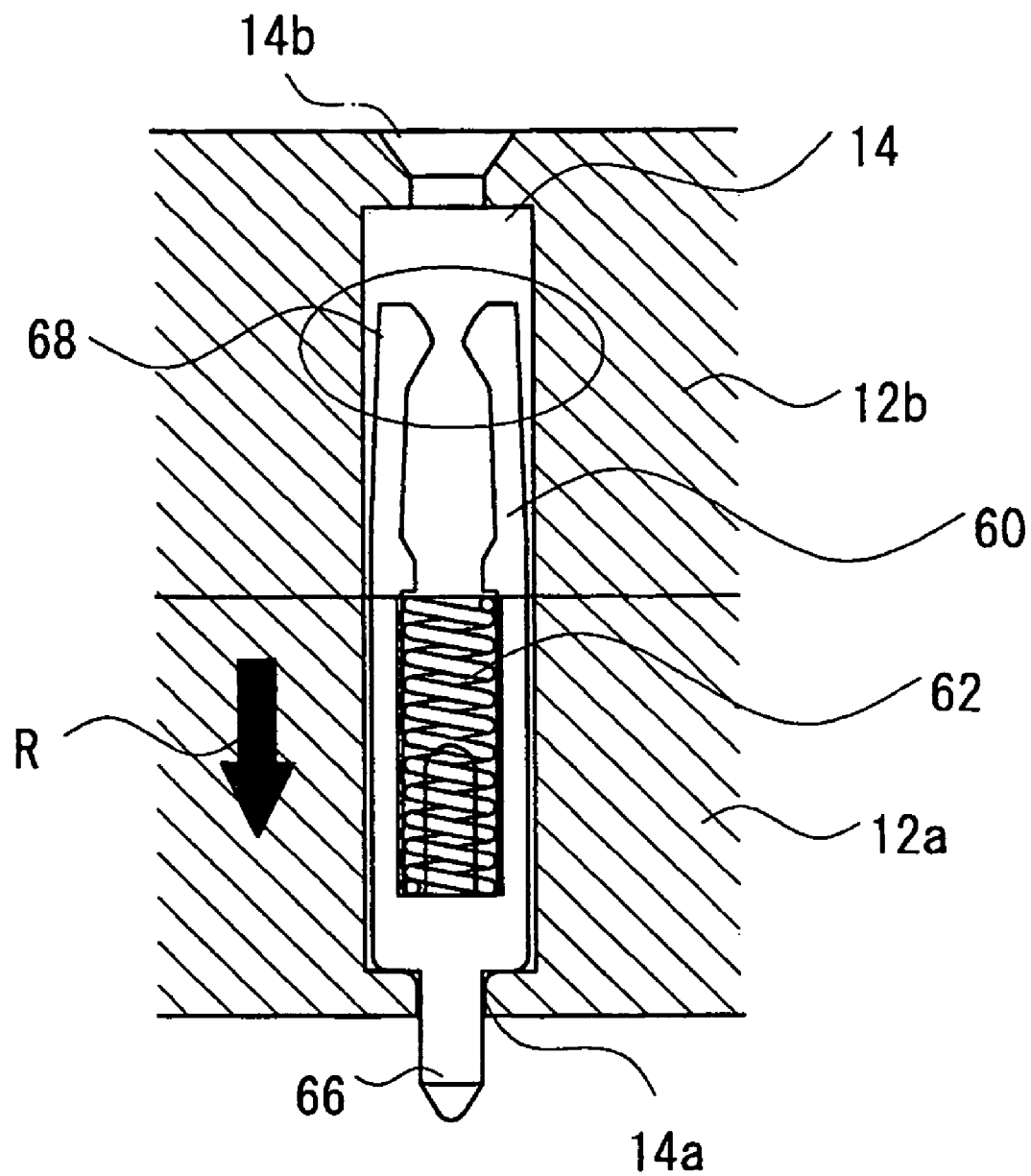
FIG. 8(a) is a view similar to FIG. 6 showing the probe pin prior to mounting on the substrate.
Figure 8B:
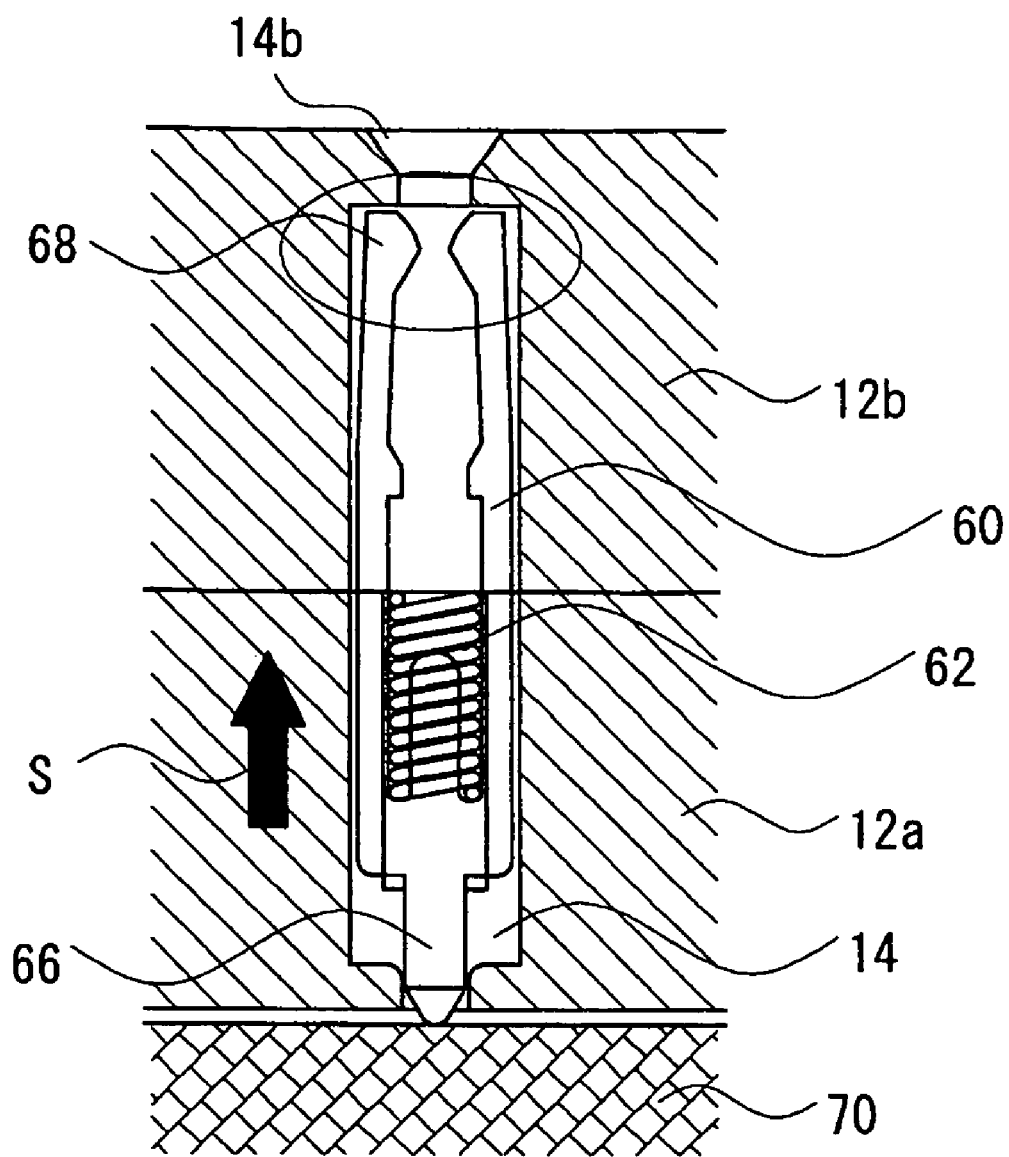
FIG. 8(b) is a view similar to FIG. 8(a) but showing the probe pin after mounting to the substrate.
Figure 8C:
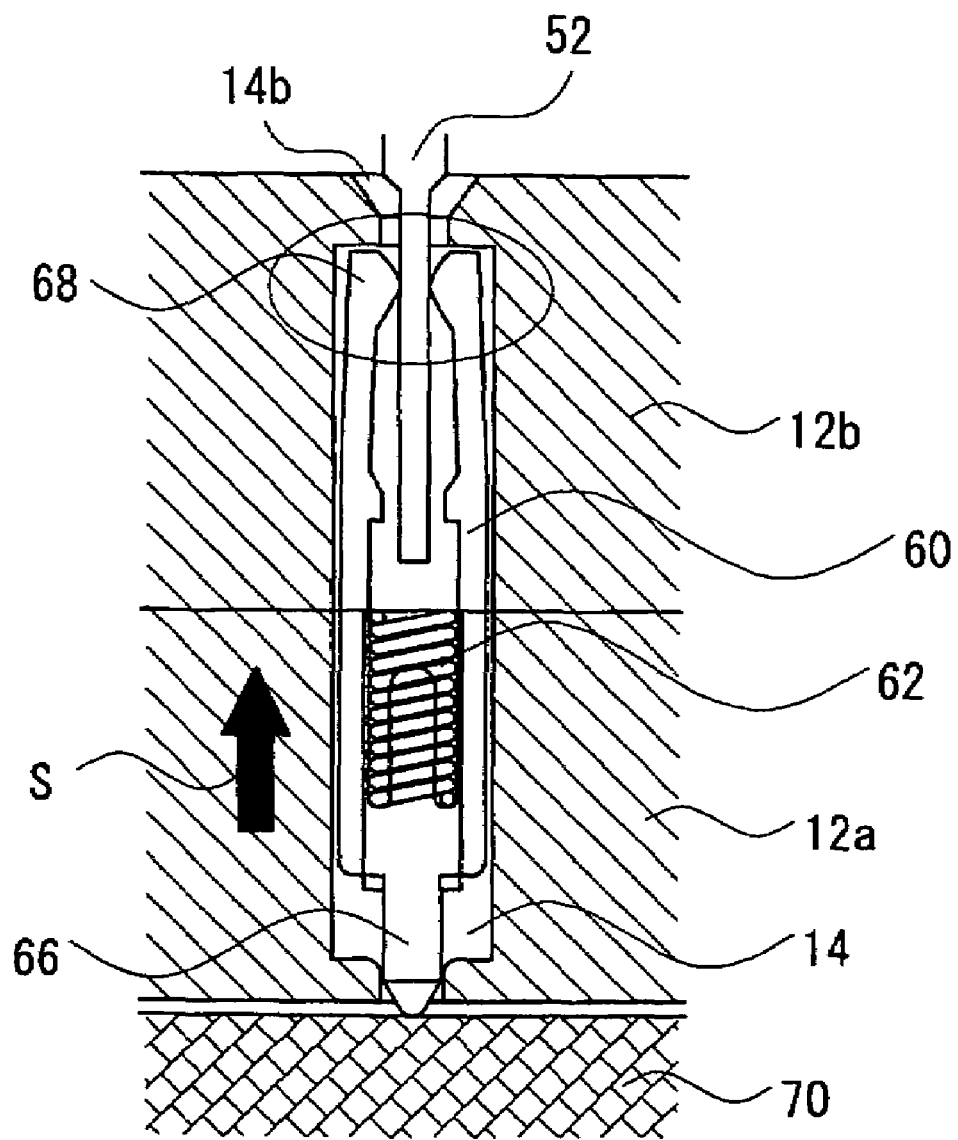
FIG. 8(c) is a view similar to FIG. 8(b) but showing the probe pin subsequent to the socket connection.

FIG. 8(*a*), similar to FIG. 6 shows the main adaptor portion with a probe pin and spring prior to its mounting on the circuit substrate. The probe pin is biased in the direction indicated by arrow mark R by means of coil spring 62 with the pin's tip part 66 extending out of the lower opening 14*a* of the main adaptor body 12.

FIG. 8(*b*) shows the state of the probe pin subsequent to its mounting on the circuit substrate. When the main adaptor body 12 has been mounted on circuit substrate 70, tip portion 66 is pressed against circuit substrate 70 and the probe pin is pushed up in the direction indicated by arrow S in opposition to the bias of coil spring 62.

Probe pins 60 slide by being guided by slots 18*a* and 18*b* that have been formed in through holes 14. As the position of the top of the coil springs are limited by the overlapping surfaces, range F, located on the lower surface of the adaptor 12*b* formed in through holes 14, a spring pressure is constantly applied to the tip portions 66 with a result that the tips 66 are made to engage the electrodes of the circuit substrate with a suitable force. If socket adaptor 10 is taken off circuit substrate 70, the socket adaptor returns to the state shown in FIG. 8 (*a*).

FIG. 8 (*c*) indicates the state of the probe pin subsequent to the connection of the socket. When the socket is connected to the main adaptor body 12, clipping part 68 clips the sides of elongated contact lead 52 that has been inserted through the upper opening 14*b*, with the contact lead 52 being electrically connected. As a result, socket 20 is connected to the circuit substrate 70 through contacts 50 and probe pins 60.

Figure 9:
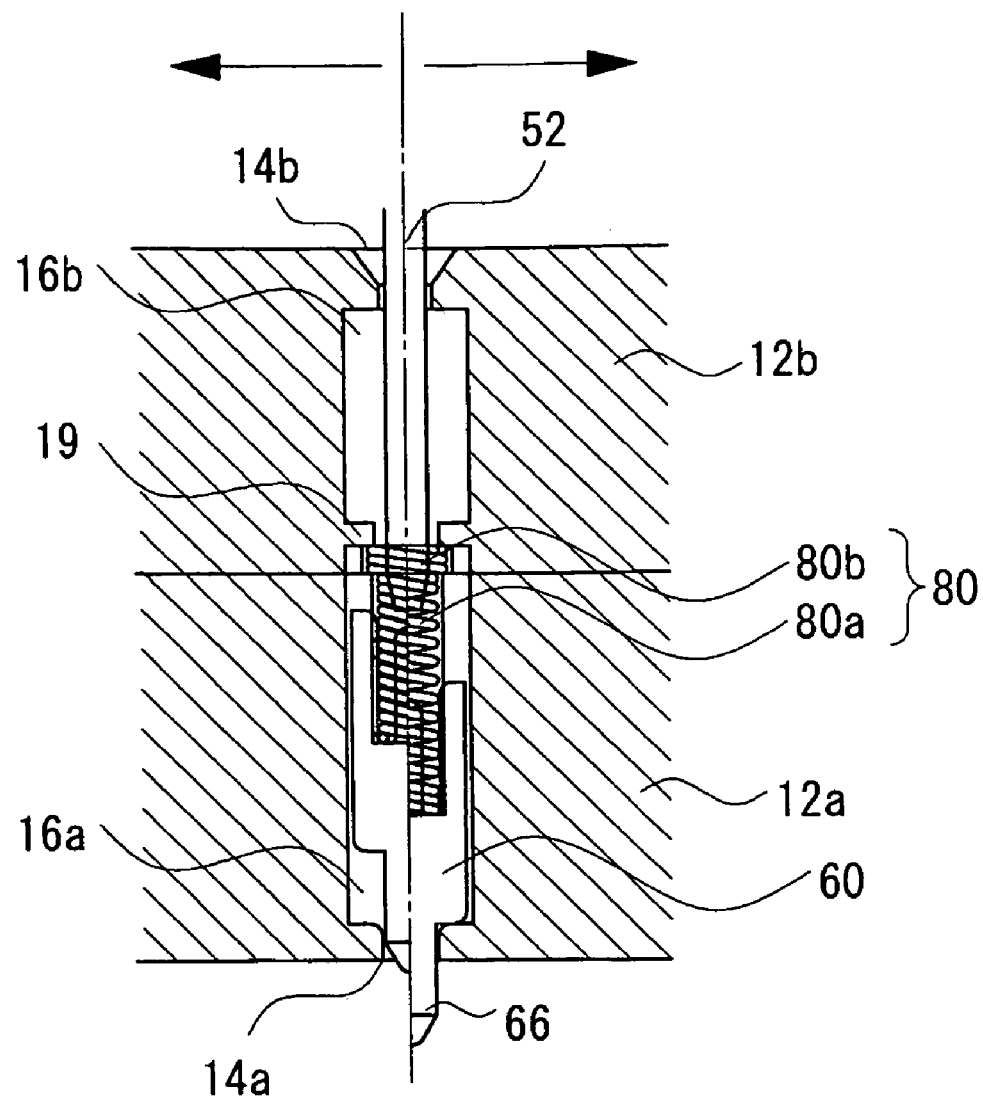
FIG. 9 is a cross-sectional front side view of a portion of the socket adaptor according to another preferred embodiment of the invention having a probe pin and shown with the probe pin in alternate positions.

Another preferred embodiment of the invention is shown in FIG. 9. In this embodiment an electrically conductive coil spring 80 is used. The coil spring 80 comprises a lower terminal portion 80*a* and a upper terminal portion 80*b* and the inner diameters of the lower portion 80*a* being smaller than the inner diameter of the upper portion 80*b*. The upper portion 80*b* of the coil spring engages the protruding portion, range F which is located on the lower surface of the upper adaptor 12*b* or, as shown in FIG. 9, tabs 19 that extend into through hole 14. As a result, the position of one end of the coil spring 80 is limited and the probe pin 60 is biased so that tip 66 protrudes out of the lower opening 14*a* at all times. This state is shown on the right side of FIG. 9.

When the main adaptor body is connected to the circuit substrate the probe pin 60 is pushed upward in a perpendicular direction in opposition to coil spring 80. At this juncture, the tip part engages the electrode of the circuit substrate with a suitable force. Then, when socket 20 is attached, and contact lead 52 that has been inserted engages the inside of the lower terminal portion 80*a* through the upper opening 14*b* and is electrically connected to probe pin 60 through coil spring 80. This state is shown in the left side of FIG. 9. As a result, BGA package 1 that has been mounted on socket 20 is connected to the circuit substrate through contact 50, coil spring 80 and probe pin 60.

Figure 10:
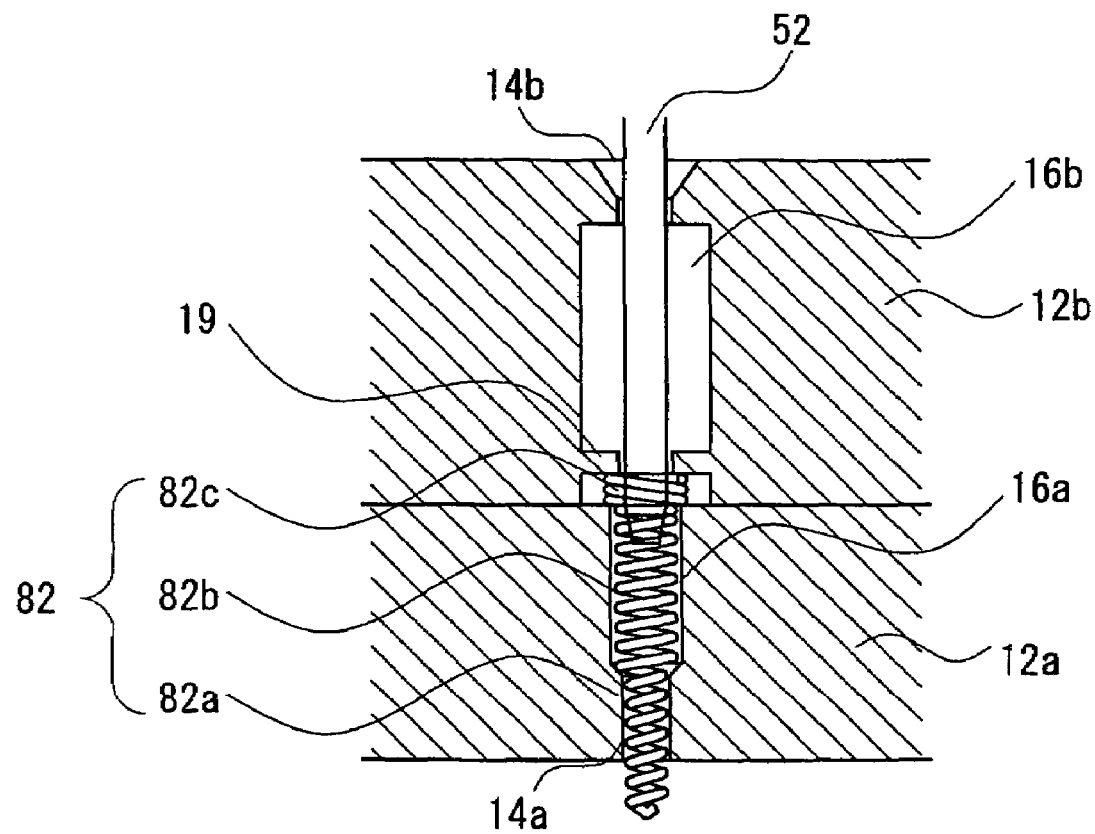
FIG. 10 is a cross-sectional front side view of a portion of a socket adaptor made in accordance with another preferred embodiment.

Another preferred embodiment of this invention will be explained with referenced to FIG. 10. An electrically conductive coil spring 82 is employed in place of the probe pin. Coil spring 82 comprises a lower end 82*a*, an intermediate part 82*b* and an upper part or terminal 82*c*. The lower end diameter is smaller than the intermediate part diameter which is smaller than the upper part diameter.

The upper end 82*c* of coil spring 82 engages protrusion surface F on the lower surface of the upper adaptor or the tabs 19 (shown in FIG. 10) that extend into through hole 14 thereby limiting the position of the top of the coil spring. In addition, the lower end 82*a* of the coil spring 82 protrudes from the main adaptor body through lower opening 14*a*.

When the main adaptor body 12 is connected to the circuit substrate the lower end 82*a* is pushed back into the main adaptor body 12. At this time the tip of the coil spring 82 engages the circuit substrate with a suitable force. When socket 20 is connected, contact lead 52 that has been inserted engages the inside of the intermediate portion 82b through the upper opening 14b for electrical connection to the coil spring 82. As a result, the BGA package 1 that has been mounted on socket 20 is connected to circuit substrate 70 through contacts 50 and coil springs 82.

According to the socket adaptor as described in the embodiment described herein, the use of a probe pin and/or coil spring obviates the need for a solder connection to the circuit substrate. This makes reuse possible. Additionally, various kinds of sockets can be used and even existing sockets can be effectively utilized.

Although the invention has been described with regards to specific preferred embodiments thereof, variations and modifications will become apparent to those of ordinary skill in the art. It is therefore, the intent that the appended claims be interpreted as broadly as possible in view of the prior art to include such variations and modifications.

What is claimed:

1. A socket adaptor for connection to a socket that mounts a semiconductor device comprises a main adaptor body made of an electrically insulating material, a plurality of through holes formed therethrough, said through holes including an upper opening and a lower opening, a probe pin made of electrically conductive material accommodlated in each said through hole, each probe pin having a clip portion that electrically engages a contact inserted from said upper surface opening and each probe pin having on its lower part a tip portion that can protrude from said lower opening, a slot formed along the through hole and in communication therewith in said main adaptor body, with said probe pin being able to slide inside said slot, and a spring member accommodated in each through hole to bias said probe pin so that said tip portion can protrude from the lower opening, said tip portion movable back through the through hole in opposition to the bias of said spring member, wherein said main adaptor body comprises an upper and a lower adaptor portion with said upper adaptor portion including a protuberant part that protrudes into the imaginary continuation of the through hole of the lower adaptor portion, said protuberant part causing directly the limiting movement of one end of said spring member that has been accommodated in the through hole of the lower adaptor portion.

2. A socket adaptor according to claim 1 in which the protuberant part that protrudes into the imaginary continuation of the through holes in the lower adaptor portion comprise a pair of tabs that are formed on the upper adaptor portion at the lower portion of each through hole.

3. A socket according to claim 1 wherein the through holes have a longitudinal axis and the shape of the through holes of said upper adaptor portion with respect to a cross-section taken perpendicular to the longitudinal axis of the upper adaptor portion through holes is approximately rectangular and the shape of the through holes of said lower adaptor portion with respect to a cross-section taken perpendicular to the longitudinal axis of the lower adaptor portion through holes is approximately circular defining the protuberant part that protrudes into the imaginary continuation of the through holes of the lower adaptor portion.

4. A socket adaptor according to claim 1 where said spring member is a coil spring that includes a contact part for electrically engaging the contact that is inserted from said upper opening.

5. A socket adaptor for connection to a socket that mounts a semiconductor device comprises a main body made of an electrically insulating material, a plurality of through holes formed therethrough, said through holes including an upper opening and a lower opening, a probe pin made of electrically conductive material accommodated in each said through hole, each probe pin having a clip portion that electrically engages a contact inserted from said upper surface opening and each probe pin having on its lower part a tip portion that can protrude from said lower opening and a coil spring member accommodated in each through hole to bias said probe pin so that said tip portion can protrude form the lower opening, said tip portion movable back through the through hole in opposition to the bias of said coil spring member, wherein each probe pin has a base and said clipping portion comprises a pair of arms extending longitudinally from the base which are elastically deformable a protrusion pan is formed on each arm extending laterally toward the opposing arm and a protuberant pin extends longitudinally from the base intermediate to the pair of arms, said coil spring member is accommodated between said pair of arms over the protuberant pin extending from said base.

6. A socket adaptor according to claim 5 where said main adaptor body includes a positioning through hole whose purpose is to determine the position for fixing the socket.

7. A socket adaptor for connection to a socket that mounts a semiconductor device comprises a main body made of an electrically insulating material, a plurality of through holes formed therethrough, said through holes including an upper opening and a lower opening, a probe pin made of electrically conductive material accommodated in each said through hole, each probe pin having a clip portion that electrically engages a contact inserted from said upper surface opening and each probe pin having on its lower pan a tip portion that can protrude from said lower opening and a coil spring member accommodated in each through hole to bias said probe pin so that said tip portion can protrude from the lower opening, said tip portion movable back through the through hole in opposition to the bias of said coil spring member, wherein each probe pin has a base and said clipping portion comprises a pair of arms extending longitudinally from the base which are elastically deformable a protrusion part is formed on each arm extending laterally toward the opposing arm, and said coil spring member is accommodated between said pair of arms on said base.

* * * * *